United States Patent
Tang et al.

(10) Patent No.: US 9,698,967 B2
(45) Date of Patent: Jul. 4, 2017

(54) DUAL PATH SOURCE SYNCHRONOUS INTERFACE

(71) Applicant: Apple Inc., Cupertino, CA (US)

(72) Inventors: Bo Tang, Sunnyvale, CA (US); Abhijit D. Choudhury, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/851,290

(22) Filed: Sep. 11, 2015

(65) Prior Publication Data

US 2017/0078080 A1    Mar. 16, 2017

(51) Int. Cl.
| | |
|---|---|
| *H04L 7/00* | (2006.01) |
| *G06F 5/06* | (2006.01) |
| *G06F 1/32* | (2006.01) |
| *G11C 11/4076* | (2006.01) |
| *H04L 12/863* | (2013.01) |
| *G11C 7/22* | (2006.01) |

(52) U.S. Cl.
CPC .............. *H04L 7/0012* (2013.01); *G06F 5/06* (2013.01); *G06F 1/324* (2013.01); *G11C 7/222* (2013.01); *G11C 11/4076* (2013.01); *H04L 47/622* (2013.01); *Y02B 60/1228* (2013.01)

(58) Field of Classification Search
CPC  Y02B 60/1228; Y02B 60/1217; G11C 7/222; G11C 11/4076; G11C 7/10; H04L 7/0008; H04L 7/0012; H04L 47/622; G06F 13/4072; G06F 13/4282; G06F 1/12; G06F 1/324; G06F 5/06
See application file for complete search history.

(56) References Cited

U.S. PATENT DOCUMENTS

| | | | |
|---|---|---|---|
| 5,844,844 A * | 12/1998 | Bauer ................... | G11C 11/412 365/189.02 |
| 6,311,285 B1 | 10/2001 | Rodriguez et al. | |
| 6,813,674 B1 * | 11/2004 | Velasco ................ | G06F 1/3203 710/309 |
| 7,076,677 B2 | 7/2006 | Falconer et al. | |
| 7,982,639 B1 * | 7/2011 | Wortman ............... | H04J 3/047 327/115 |
| 8,467,486 B2 | 6/2013 | Pyeon | |
| 8,514,994 B1 * | 8/2013 | Lee ..................... | H03K 19/1737 375/354 |
| 8,737,162 B2 | 5/2014 | Ware et al. | |
| 2013/0121383 A1 * | 5/2013 | Sadowski ............ | G11C 7/1066 375/211 |
| 2015/0372802 A1 * | 12/2015 | Sadowski ............ | G06F 13/38 370/503 |

* cited by examiner

*Primary Examiner* — Michelle M. Koeth
(74) *Attorney, Agent, or Firm* — Meyertons, Hood, Kivlin, Kowert & Goetzel, P.C.; Erik A. Heter

(57) ABSTRACT

A dual path source synchronous interface is disclosed. In one embodiment, a source synchronous interface includes a transmitter coupled to serially receive data from a first functional circuit block, and a receiver coupled to provide data serially to a second functional circuit block. Data is conveyed to the transmitter on a single signal line, and similarly, from the receiver on another single signal line. The transmitter is coupled to the receiver by two signal lines. The serial data received by the transmitter may be separated into two streams of alternating bits, e.g., a first bit is transmitted on one signal line, the next bit is transmitted on the other signal line, and so forth. At the receiver, the alternating bit streams may be re-combined into a single bit stream for transfer to the second functional circuit.

18 Claims, 9 Drawing Sheets

DUAL PATH SOURCE SYNCHRONOUS INTERFACE

BACKGROUND

Technical Field

This disclosure is directed to electronic systems having integrated circuits, and more particularly, to signal transmission in and between integrated circuits.

Description of the Related Art

As the speed at which integrated circuits operate has increased, there has been a corresponding increase in the challenges of signaling. In particular, ensuring signal integrity, and thus data integrity, is a critical factor in any successful integrated circuit design, as well as for any electronic system in which signals are transmitted from one integrated circuit to another.

Speed and distance are two related factors to be considered in determining a signaling strategy. At longer distances, signals may degrade over time, adversely affecting the ability of a receiver to correctly interpret the data contained therein. Factors such as resistance in the transmission paths may cause degradation of signals in flight. Process, voltage, and temperature variations can also be factors in signal degradation. Moreover, as clock speeds increase, distance becomes more of a challenge. This is due to smaller time windows at which signals must arrive at their respective destinations.

In some cases, devices such as repeaters may be placed in a signal path between a transmitter and receiver. Such repeaters may provide strength to signals that may otherwise degrade in transmission. Another signaling technique is to use source synchronous signaling, in which a clock signal is transmitted along with the data signals.

SUMMARY

A dual path source synchronous interface is disclosed. In one embodiment, a source synchronous interface includes a transmitter coupled to serially receive data from a first functional circuit block, and a receiver coupled to provide data serially to a second functional circuit block. Data is conveyed to the transmitter on a single signal line, and similarly, from the receiver on another single signal line. The transmitter is coupled to the receiver by two signal lines. The serial data received by the transmitter may be separated into two streams of alternating bits, e.g., a first bit is transmitted on one signal line, the next bit is transmitted on the other signal line, and so forth. At the receiver, the alternating bit streams may be re-combined into a single bit stream for transfer to the second functional circuit.

A method of transferring data over a source synchronous interface includes receiving data serially in a first bit stream, at a first data rate. The data may be separated into two separate bit streams and transmitted from a transmitter to a receiver. The two separate bit streams may be transferred at a second data rate that is one half the first data rate. At the receiver, the two separate bit streams may be recombined into a single bit stream.

BRIEF DESCRIPTION OF THE DRAWINGS

The following detailed description makes reference to the accompanying drawings, which are now briefly described.

Figure 1:
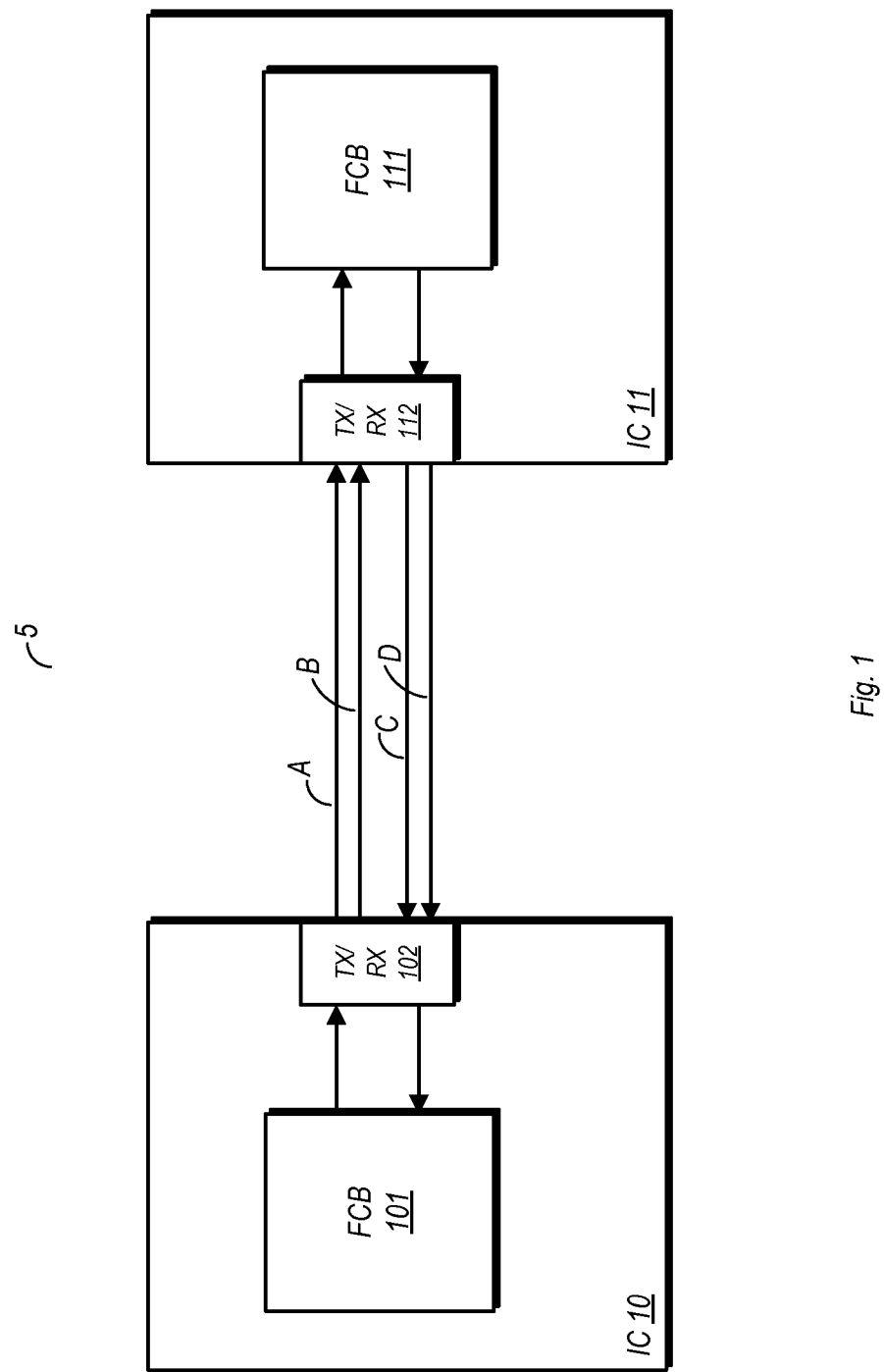
FIG. 1 is a block diagram of one embodiment of an electronic system.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) (or pre-AIA paragraph six) interpretation for that unit/circuit/component.

DETAILED DESCRIPTION OF EMBODIMENTS

FIG. 1 is a block diagram of one embodiment of an exemplary system. In the embodiment shown, FIG. 1 includes a first integrated circuit (IC) 10, and a second IC 11. First IC 10 includes a functional circuit block 101 that may communicate with a functional circuit block 111 implemented in IC 11. The two ICs in the embodiment shown are coupled by a source synchronous interface that includes transceiver 102 (in IC 10) and transceiver 112 (in IC 11).

Functional circuit block 101 may send data serially to transceiver 102 via a single signal path. The data may be sent to transceiver 102 at a first data rate. The transmitter in transceiver 102 may split the received data such that it is transmitted on two separate signal paths (or signal lines), path A and path B as shown in the drawing. On each of the two separate paths, the data transmitted thereon may be conveyed at a second data rate that is one half the first data rate. For example, if the data is conveyed to transceiver 102 according to a clock rate of 1 GHz, the data transmitted on paths A and B may each be conveyed at a clock rate of 500 MHz. A receiver in transceiver 112 may receive the data from the two separate paths. Although the data from an individual one of paths A and B are received at half the rate at which it was initially conveyed to transceiver 102, receiver 112 effectively receives data at the first data rate given that it is receiving data from both paths. The data may be then re-combined onto a single data path and conveyed, at the first data rate, to functional circuit block 111.

Functional circuit block 111 may convey data to functional circuit block 101 as described above, via signal paths C and D. Transceiver 112 may receive the data at the first data rate and transmit the same onto signal paths C and D at the second data rate. A receiver in transceiver 102 may receive the data from each of signal paths C and D, recombine it into a single bit stream, and convey it at the first data rate to functional circuit block 101.

Figure 2:
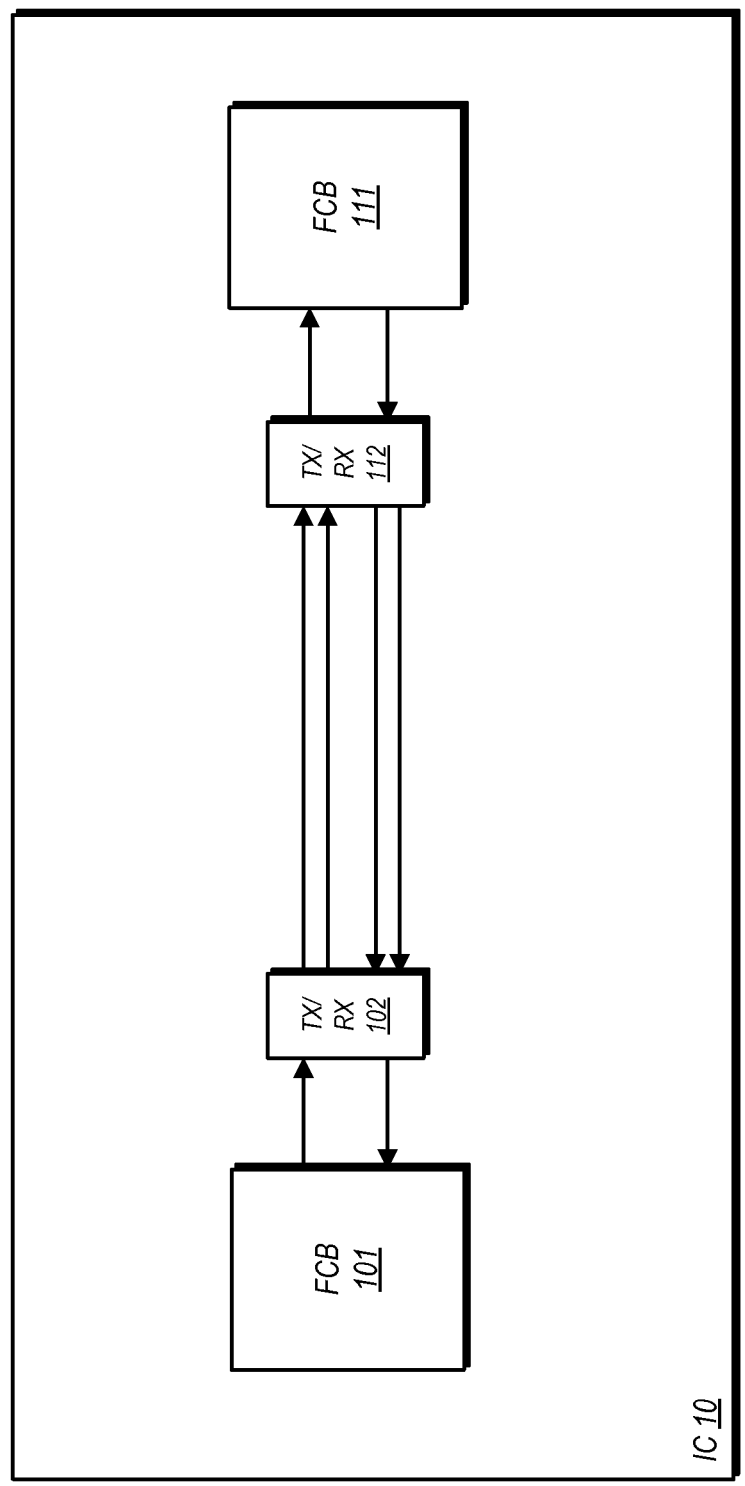
FIG. 2 is a block diagram of one embodiment of an integrated circuit.

FIG. 2 is a block diagram of one embodiment of an IC. In the embodiment shown, IC 10 includes functional circuit blocks 101 and 111, which are coupled to one another by a source synchronous interface. Data transfer between the two functional circuit blocks may occur in the manner as described above with respect to system 5. In general, the source synchronous interface described herein may be used for intra-IC communications and inter-IC communications. System embodiments which are arranged to conduct source synchronous communications as described herein in both intra-IC and inter-IC interfaces are possible and contemplated.

Figure 3:
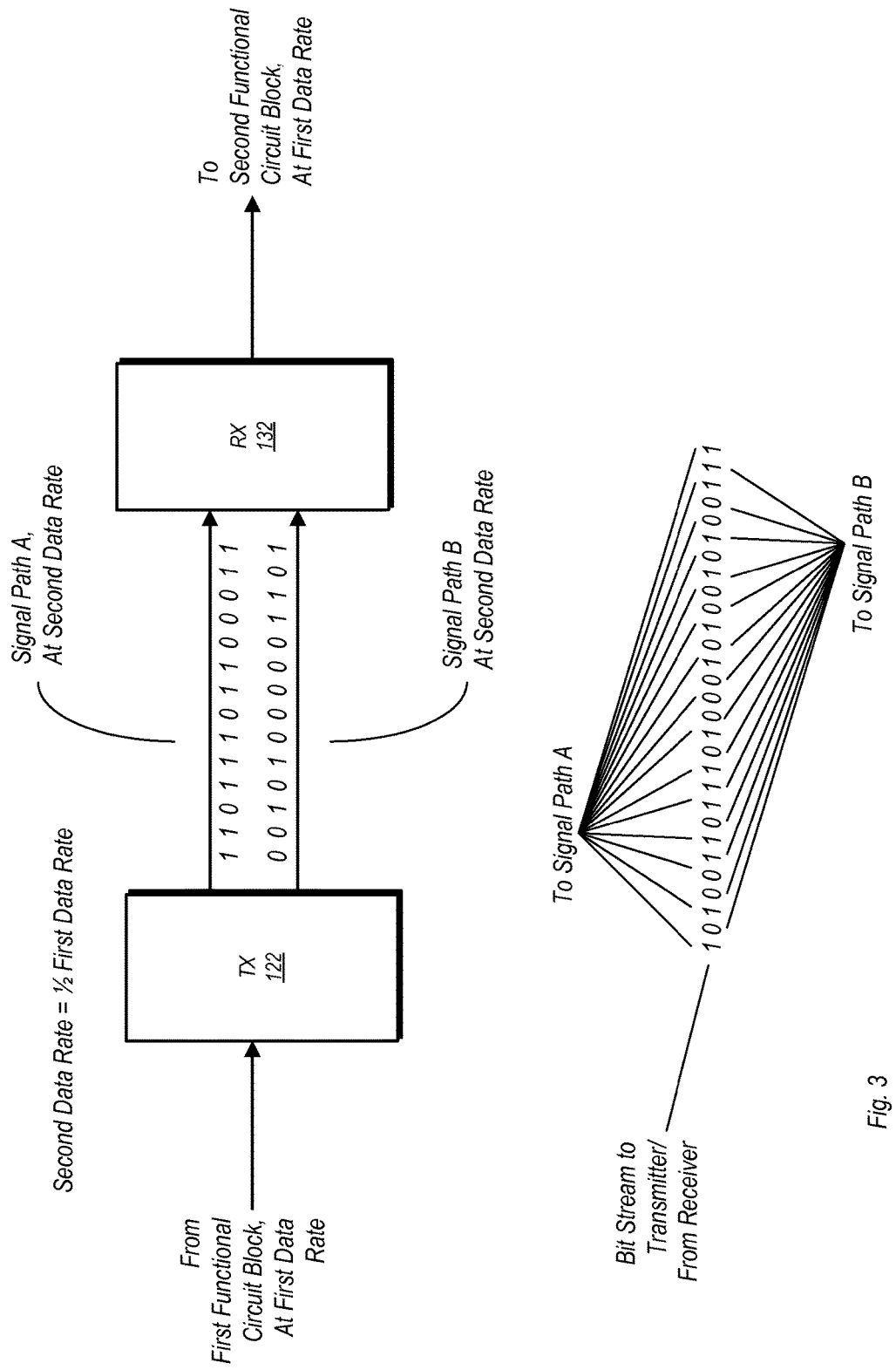
FIG. 3 is a block diagram of one embodiment of a dual-path source synchronous interface.

Turning now to FIG. 3, a block diagram of one embodiment of a dual-path source synchronous interface is provided to further illustrate the operation thereof. In the embodiment shown, transmitter 122 is coupled to receiver 132 in accordance with the operations of a source synchronous interface as described above. Data, in the form of a serially-conveyed bit stream, is received from a functional circuit block by transmitter 122 at a first data rate. Transmitter 122 may split the data into two separate bit streams. A first of these bit streams is transmitted over signal path A, while the second of these bit streams is transmitted over signal path B. The bit streams transmitted over signal paths A and B are conveyed at a second data rate that is one half the first. At receiver 132, the bit streams received from signal paths A and B are recombined into a single stream and conveyed, at the first data rate to a second functional circuit block.

FIG. 3 also illustrates how the initially received bit stream is subdivided for transmission across signal paths A and B. The bit stream may be received serially, at the first data rate (or clock rate). A first bit may be routed to signal path A, while a second bit may be routed to signal path B. More generally, alternating bits may be routed to signal paths A and B, i.e. "odd" bits ($1^{st}$ bit, $3^{rd}$ bit, $5^{th}$ bit, etc.) may be routed to signal path A, while "even" bits ($2^{nd}$ bit, $4^{th}$ bit, $6^{th}$ bit, etc.) may be routed to signal path B. This allows the overall data rate to remain the same, even though the data rate at which the separated bit streams are conveyed on signal paths A and B may be one half the overall data rate.

Figure 4:
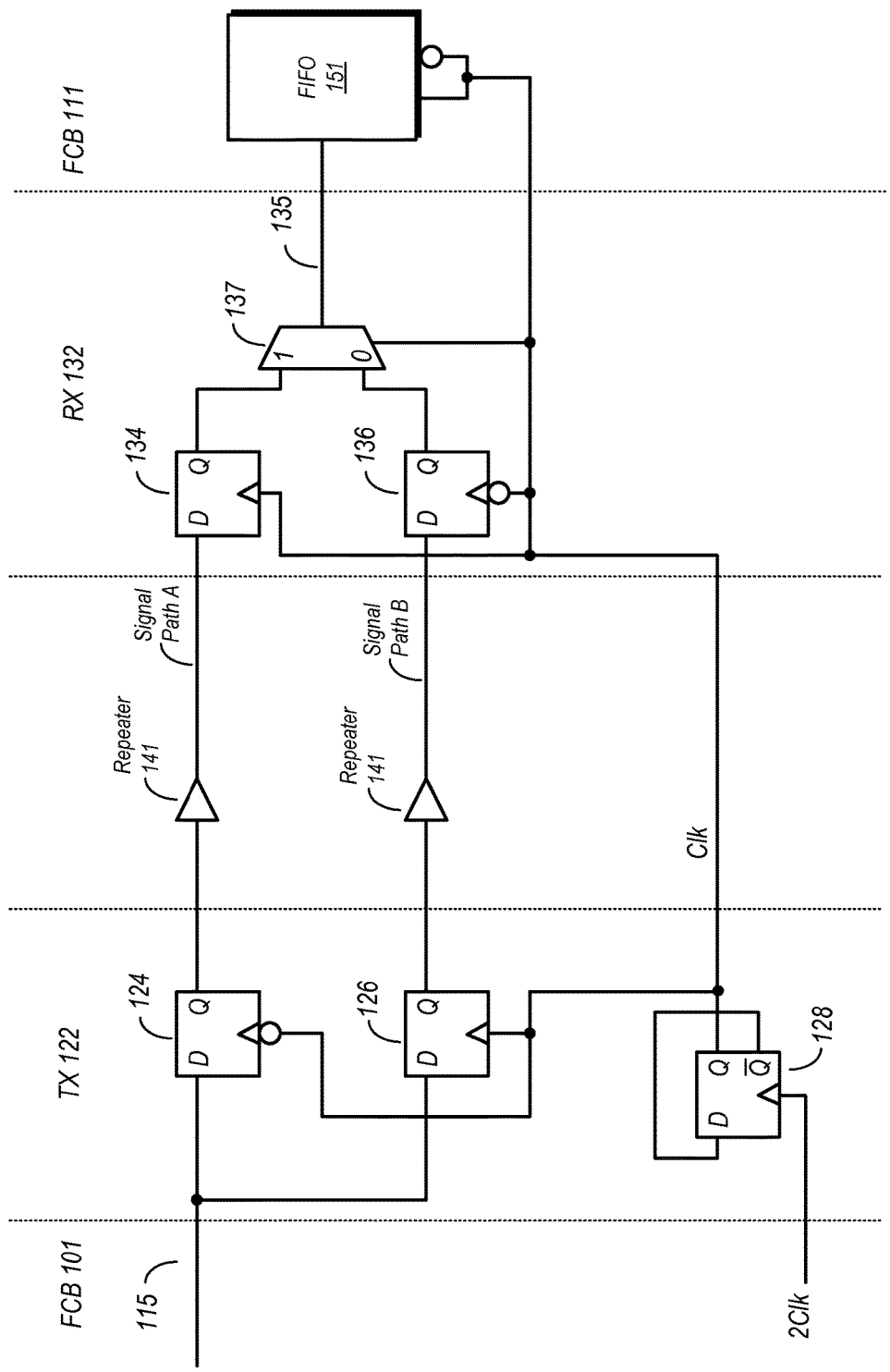
FIG. 4 is a logic diagram of one embodiment of a dual-path source synchronous interface.
Figure 5:
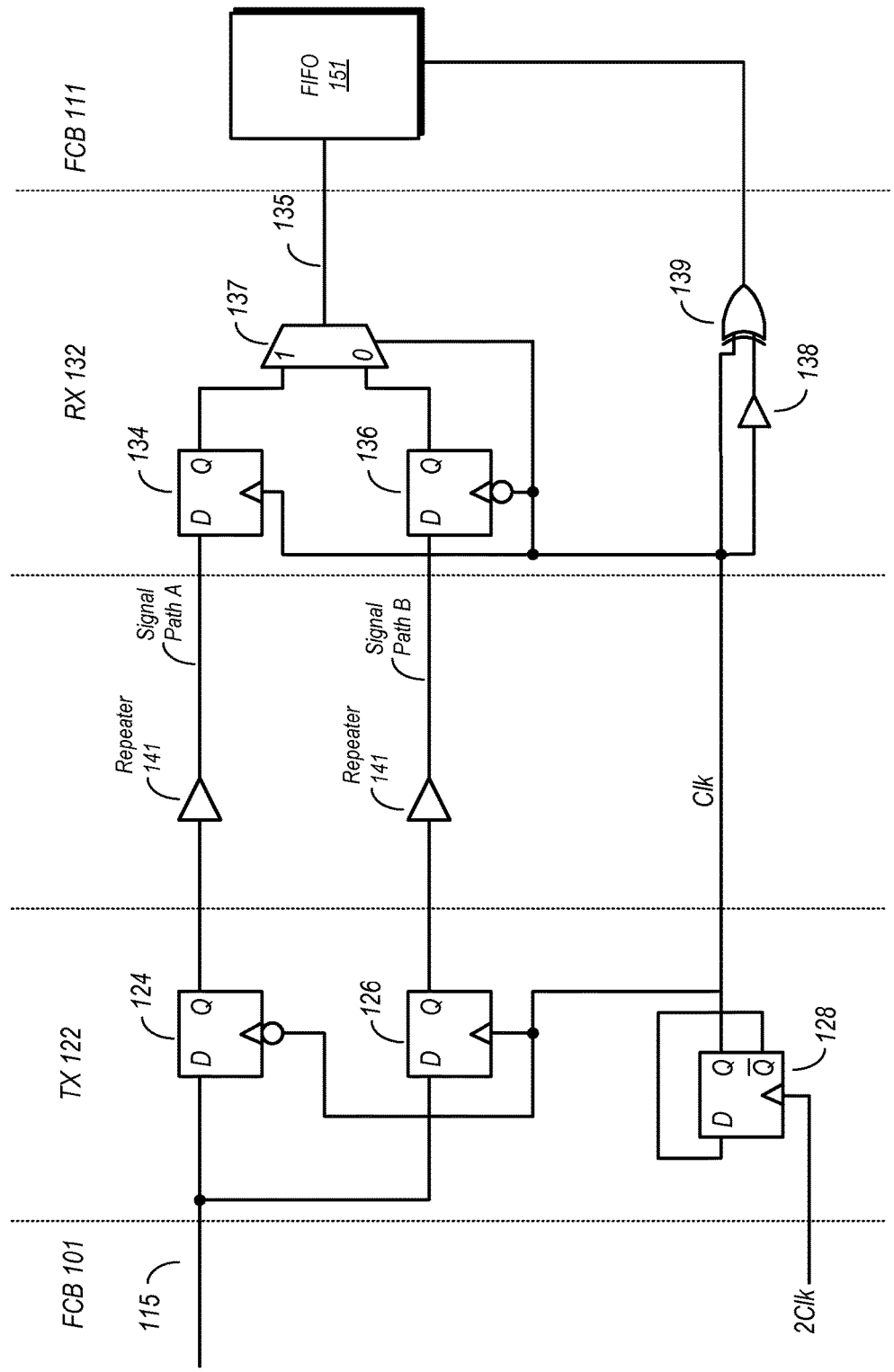
FIG. 5 is a logic diagram of another embodiment of a dual-path source synchronous interface.
Figure 6:
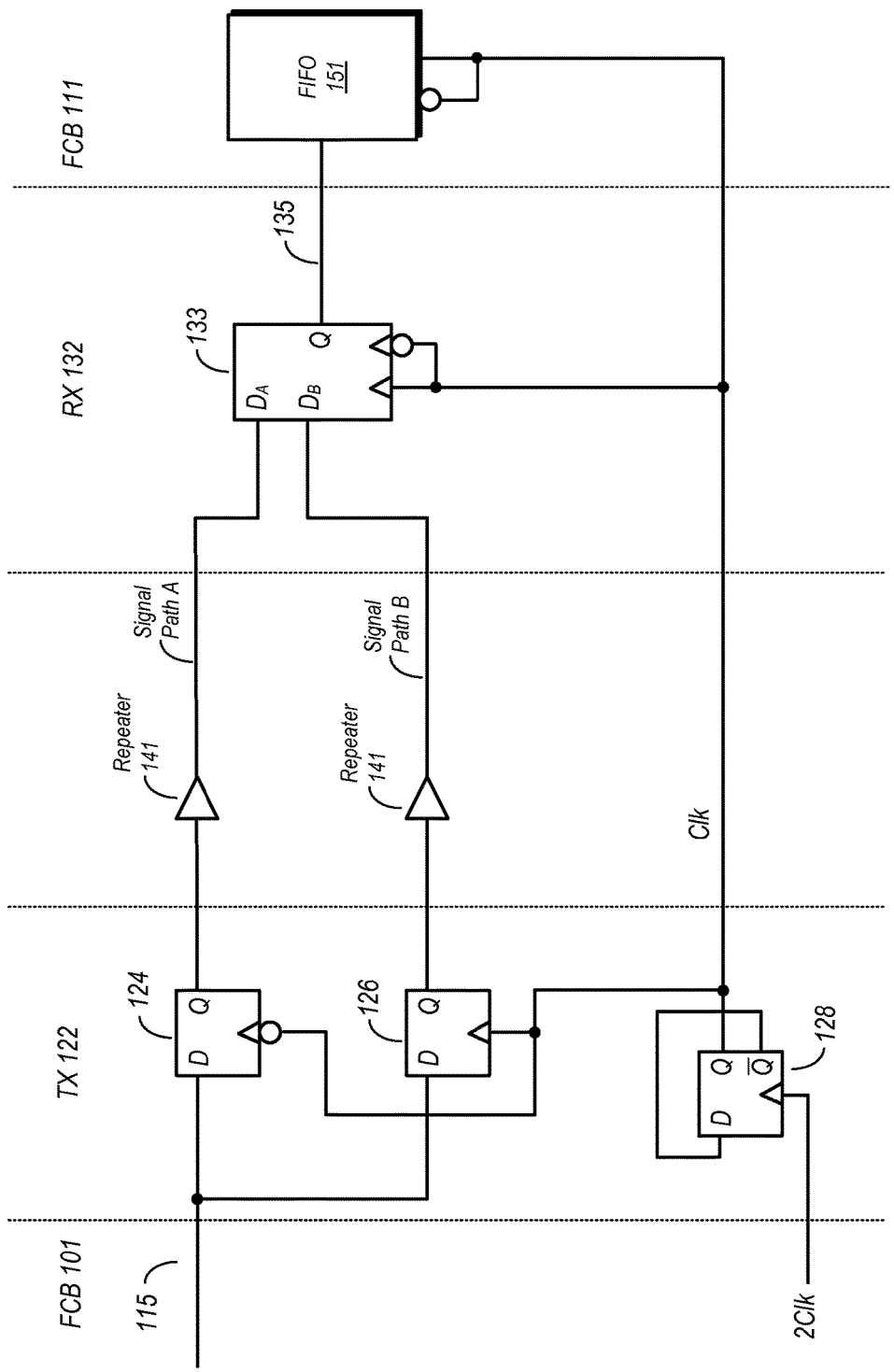
FIG. 6 is a logic diagram of another embodiment of a dual-path source synchronous interface.

Although not explicitly shown in FIGS. 1-3, a clock signal may be conveyed from a transceiver to a receiver, along with the data. FIGS. 4-6 as discussed below illustrate apparatus embodiments that include a path for a clock signal to be transmitted along with the data.

FIG. 4 is a logic diagram of one embodiment of a dual-path source synchronous interface. In the embodiment shown, data may be conveyed serially across signal line 115, from functional circuit block 101 to transmitter 122. Transmitter 122 in this embodiment includes a flip-flops 124 and 126, each of which includes a data input ('D') coupled to signal line 115. The data outputs ('Q') of flip-flops 124 and 126 are coupled to signal paths A and B, respectively. Flip-flop 124 in the embodiment shown is arranged to be triggered on the negative edge of the clock signal, Clk. Accordingly, flip-flop 124 may become transparent responsive to the falling edge of the clock signal. Flip-flop 126 in the embodiment shown is arranged to be triggered on the positive edge of the clock signal. Accordingly, flip-flop 126 may become transparent responsive to the rising edge of the clock signal. Furthermore, given the arrangement shown, only one of flip-flops 124 and 126 is transparent at any given time. As such, the bit stream that is serially received via signal line 115 is divided into two separate bit streams by transmitter 122, with approximately one half the data being conveyed through flip-flop 124 and the remaining data being conveyed through flip-flop 126. Since flip-flop 124 is negative-edge triggered, it also transmits data onto signal path A responsive to the falling edge of the clock signal. Flip-flop 126 is configured to transmit data onto signal path B responsive to the rising edge of the clock signal.

It is noted that each of signal paths A and B in the embodiment shown include a respective repeater 141. A repeater may be implemented in various ways. In one embodiment, a repeater may be implemented as a buffer/driver circuit (e.g., using a pair of inverters). In another embodiment, a repeater may be implemented using a latch or flip-flop circuit or combined buffers/flip-flops. In either case, the repeater on a given signal line may effectively refresh the strength of the signal being transmitted between transmitter 122 and receiver 132. This in turn may ensure the integrity of the data contained in the signal. In some cases, a repeater may provide a small amount of delay that can in turn ensure the proper amount of setup and hold time for each signal at its respective receiver. In instances where the time of flight along a signal path is long enough to affect setup and hold times at the receiver, a flip-flop may be used to meet the timing requirements. Similarly, if the timing of signal exceeds the maximum and minimum limit in the signal line, the use of one or multiple alternative edge triggered flip-flop as repeaters will allow the same data rate delivery in the bus.

In the embodiment shown, transmitter 122 includes a third flip-flop. Flip-flop 128 as shown here functions as a clock divider. More particularly, flip-flop 128 may frequency divide an incoming clock signal, 2Clk, by two in order to generate the clock signal, Clk, which is conveyed on the source synchronous interface. For example, if 2Clk has a frequency of 1 GHz, Clk may have a frequency of 500 MHz. Dividing the incoming clock signal by two enables the arrangement of flip-flops 124 and 126 to divide the incoming serial bit stream into two separate serial bit stream for transmission over signal paths A and B. Accordingly, the overall data rate between functional circuit block 101 and 111 may be maintained. The clock signal produced by flip-flop 128 (from the Q output) may also be transmitted across the source synchronous interface to receiver 132.

In the embodiment shown, receiver 132 includes flip-flops 134 and 136, along with multiplexer 137. The arrangement of these elements shown may serve to recombine the serial bit streams received from signals paths A and B into a single bit stream that is equivalent to the original conveyed from functional circuit block 101. Flip-flop 134 in the embodiment shown is triggered on the positive edge of the clock signal. Accordingly, flip-flop 134 becomes transparent responsive to the rising edge of the clock signal. A data bit transmitted from transmitter 124 on a falling edge of the clock signal may be latched into flip-flop 134 on the next rising edge. Flip-flop 136 in the embodiment shown is triggered by the negative edge of the clock signal. Accordingly, flip-flop 136 may become transparent responsive to the falling edge of the clock signal. A data bit transmitted from flip-flop 126 on a rising edge of the clock signal may be latched into flip-flop 136 responsive to the next falling edge.

Multiplexer 137 in the embodiment shown is a 2-1 multiplexer having a first data input coupled to the data output of flip-flop 134 and a second data input coupled to the data output of flip-flop 136. A selection input of multiplexer 137 is coupled to receive the clock signal. When the clock signal is high in the embodiment, the output of flip-flop 134 is selected. Flip-flop 134 is arranged respective to multiplexer 137 such that it is transparent when its output is selected. When the clock signal is low in this embodiment, the output of flip-flop 136 is selected. Flip-flop 136 is arranged respective to multiplexer 137 such that it is transparent when its output is selected. The output of multiplexer 137 is coupled to signal line 135. Due to the arrangement of flip-flops 134 and 136, along with multiplexer 137, the individual bits of the original bit stream are re-assembled, in order, on signal line 135. Furthermore, since the selected output of multiplexer 137 changes every half cycle of the clock signal, the bit stream is conveyed on signal line 135 at the same data rate at which it was conveyed on signal line 115.

In this particular embodiment, functional circuit block 111 includes a first-in, first out memory (FIFO) 151 that is coupled to receive the serially transmitted bit stream via signal line 135. FIFO 151 in this embodiment is dual-edge triggered, and thus receives another bit of data every half clock cycle. Accordingly, the rate at which data is received by FIFO 151 matches that at which it is conveyed on signal line 135. It is noted that FIFO 151 is not required in all embodiments, i.e. some embodiment of functional circuit block 111 do not include a FIFO.

FIGS. 5 and 6 are variations on the embodiment of FIG. 4. In the embodiment shown in FIG. 5, FIFO 151 of functional circuit block 111 is a single-edge triggered FIFO. Accordingly, to maintain the overall data rate of the source synchronous interface, FIFO 151 receives a signal equal to that of the 2Clk signal. Accordingly, receiver 132 in the embodiment shown includes a clock doubler circuit that is implemented using delay element 138 and exclusive OR (XOR) gate 139. Delay element 138 is coupled to one input of XOR gate 139, while the other input is coupled to directly receive the clock signal. Due to the delay, the inputs to XOR gate 139 are different for part of the cycle of the input clock cycle, producing a logic 1. When the inputs are equal, a logic 0 is output. An input value provided to the clock doubler circuit will initially produce a logic 1 on the output of XOR gate 139. After the input has propagated through delay element 138, the output of XOR gate 139 falls to a logic 0.

Thus, the output of XOR gate 139 will produce a periodic signal having twice the frequency of Clk. The duty cycle of the output signal depends on the delay provided by delay element 138. In one embodiment, the delay may be set such that the duty cycle of the signal output from XOR gate 139 is approximately 50%. However, the delay of delay element may be set to produce other duty cycle values if desired. Irrespective of the duty cycle, the output of XOR gate 139 is a periodic signal having a frequency twice that of the input clock signal. This signal is provided to FIFO 151, which may then consume the data that is serially conveyed on signal line 135 at the first data rate.

In FIG. 6, dual-edge triggered flip-flop 133 is used in place of the two flip-flops and multiplexer in the embodiment shown in FIG. 4. Dual-edge triggered flip-flop 133 includes two data inputs, one coupled to signal path A and one coupled to signal path B. Each clock edge, both rising and falling, trigger the flip-flop to be transparent to one of the signal paths. A first clock edge may result in the flip-flop being transparent to signal path B while a second clock edge may result in the flip-flop being transparent to signal path A Dual-edge triggered flip-flop 133 includes a single output coupled to signal line 135, and provides a previously latched value from signal path B or signal path A responsive to each clock edge. Thus, dual-edge triggered flip-flop 133 in the embodiment shown effectively accomplishes the same functions as the two flip-flops and multiplexer shown in the embodiment of FIG. 4.

Figure 7:
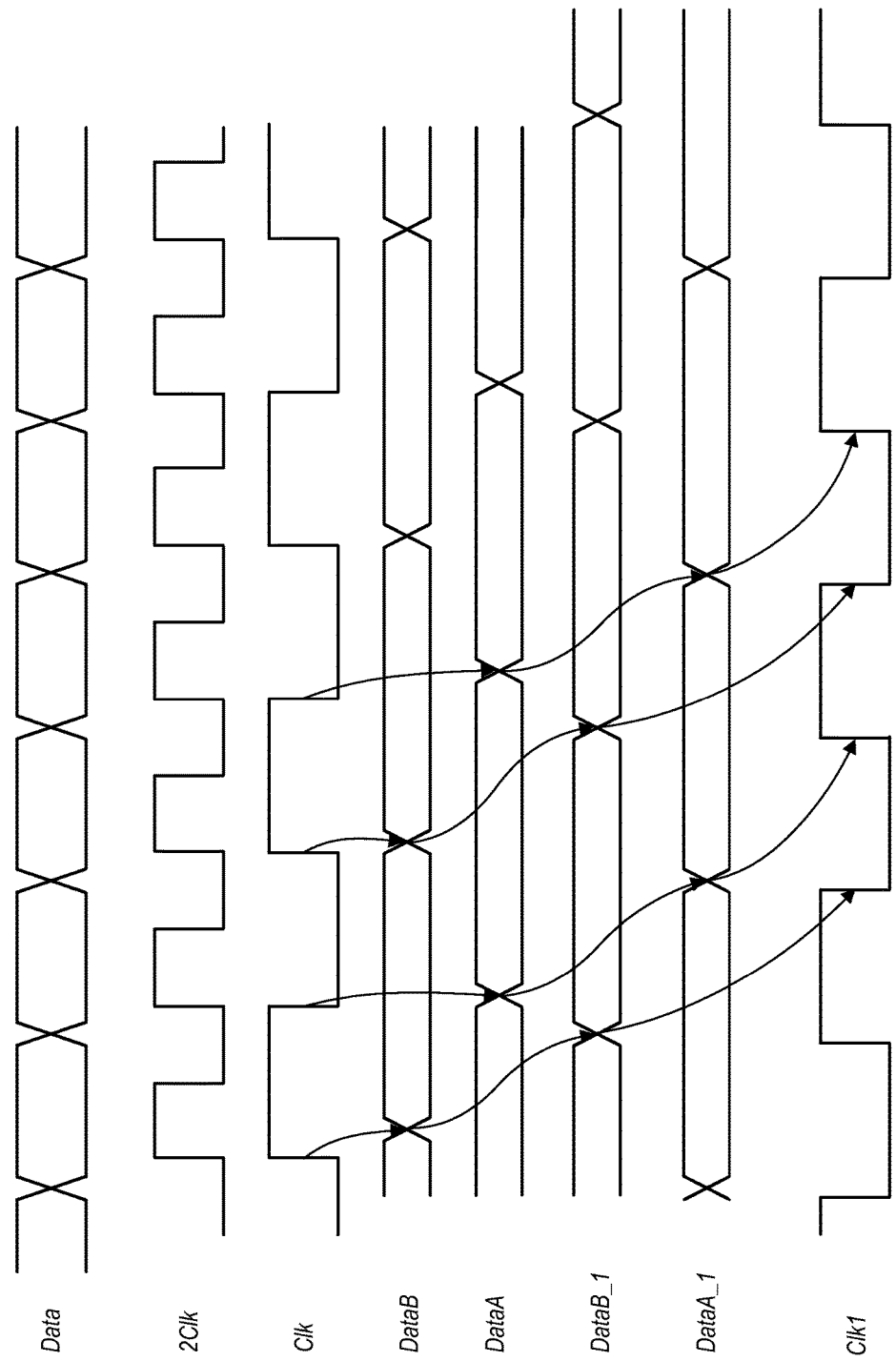
FIG. 7 is a timing diagram illustrating operation of one embodiment of a dual-path source synchronous interface.

FIG. 7 is a timing diagram illustrating operation of one embodiment of a dual-path source synchronous interface. The illustrated example shows the relationships between the various signals in one embodiment of a source synchronous interface operating in accordance with the principles discussed herein. The data signal ('Data') is initially conveyed serially on a single path, at a data rate according to the frequency of the clock signal 2Clk. The frequency of this clock signal is divided by two in order to produce the clock signal, Clk. The clock signal Clk is used in conjunction with other circuitry to separate the initial stream of serial data into two streams of serial data, DataA and DataB. The data rate for both DataA and DataB is one half that of the initial data stream, Data. This is due to the fact that DataA and DataB are transmitted in accordance with Clk instead of 2Clk.

DataA_1 and DataB_1 are representative of DataA and DataB as conveyed to the receiver of the source synchronous interface. Similarly, Clk1 is representative of the clock signal as conveyed to the receiver. In this example, DataB is transmitted responsive to the rising edge of Clk, while DataB_1 is received responsive to the falling edge of Clk1. Similarly, DataA is transmitted responsive to the falling edge of Clk, while DataA_1 is received responsive to the rising edge of Clk1.

Figure 8:
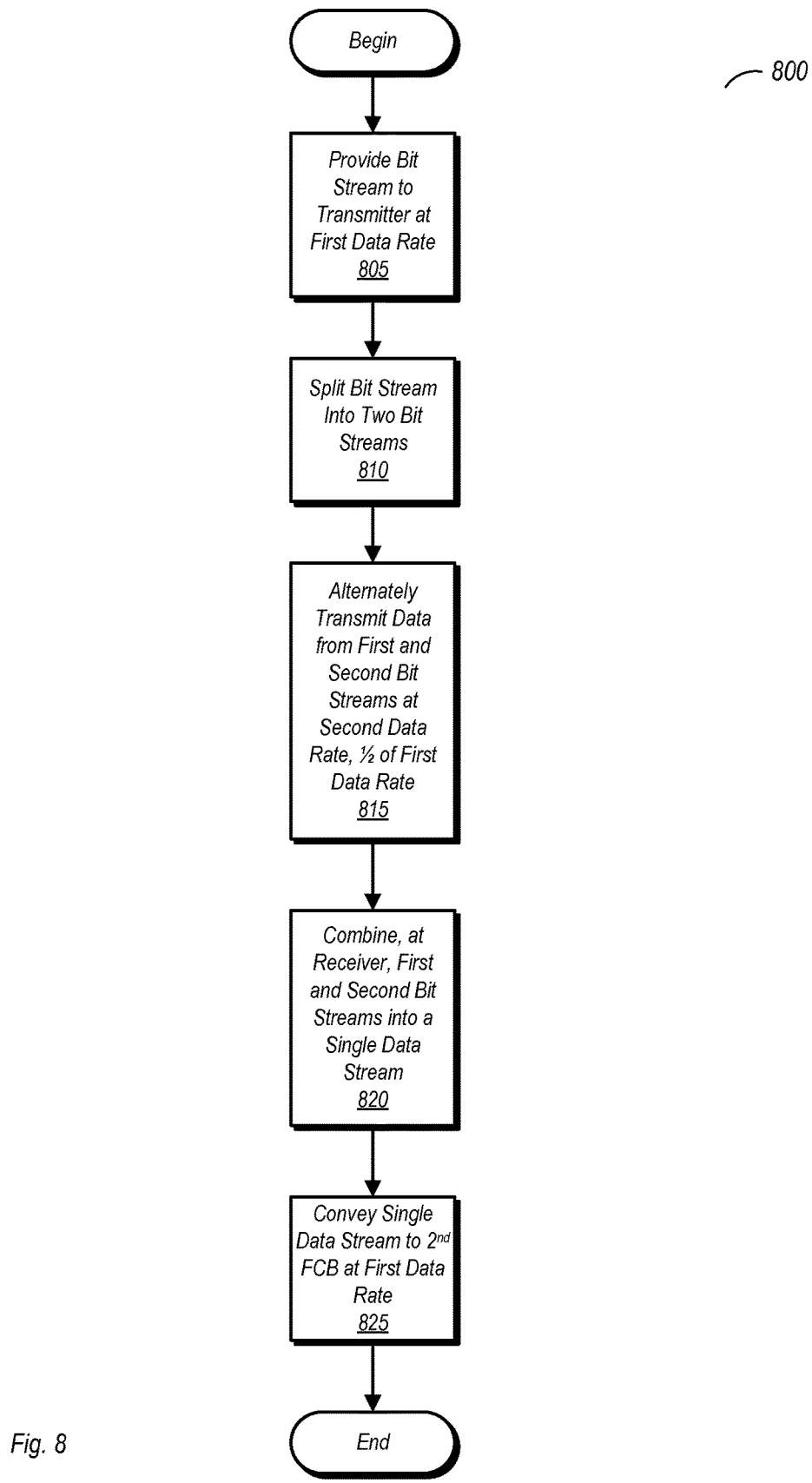
FIG. 8 is a flow diagram illustrating one embodiment of a method for operating a dual-path source synchronous interface.

FIG. 8 is a flow diagram illustrating one embodiment of a method for operating a dual-path source synchronous interface. Method 800 as shown herein may be implemented using any one of the apparatus embodiments discussed above. Furthermore, apparatus embodiments not explicitly discussed herein that are capable of performing method 800 are also possible and contemplated.

Method 800 begins with providing a bit stream, in serial and to a transmitter of a source synchronous interface, at a first data rate (block 805). The data may constitute communications/transactions between a first functional circuit block and a second functional circuit block. At the transmitter, the data may be split into two separate bit streams (block 810). In one embodiment, the bits of the initial bit stream may be split by alternately providing bits to one or the other of the two separate bit streams. For example, first bit may be provided to the first bit stream, a second bit may be provided to a second bit stream, a third bit may be provided to the first bit stream, a fourth bit may be provided to the second bit stream, and so on.

After splitting the data, the two separate bit streams may be transmitted on respective signal paths at a second data rate that is one half of the first data rate (block 815). The bits of the two bit streams may be transmitted in an alternate manner, similar to how the initial bit stream was split, to maintain order. Thus, the first bit may be transmitted on the first signal line, followed by the second bit being transmitted on the second signal line, the third bit being transmitted on the first signal line, and so forth.

At the receiver, the data bits from both the first and second bit streams may be received and combined back into a single stream (block 820). The bits of the combined bit stream may be in an order identical to the bit stream that was initially sent to the transmitter of the source synchronous interface. After recombining the bits of the separate bit streams, the resulting single bit stream may be conveyed to the receiving functional circuit block at the first data rate (block 825).

The various method and apparatus embodiments may provide certain advantages over previous source synchronous interfaces. Although two signal lines are used instead of one, the data transferred on each may be sent at a slower rate, while the overall rate of data transfer is not compromised. The data that is sent over the two separate signal paths may be less subject to clock duty cycle distortion, on chip variations, and other factors that can adversely affect signal integrity. This in turn may also enable the data to be transferred for much longer distances. Furthermore, since the clock frequency conveyed from transmitter to receiver is one half that of the original clock frequency, dynamic power consumption is reduced. Depending on data patterns, there may also be a reduction in dynamic power consumption from the data itself.

Alternate embodiments of the various interfaces discussed above can be used to double the transfer speed by doubling the data rate at which data is conveyed to and from the source synchronous interface, while maintaining the clock frequency of the clock signal used to transfer data across the interface.

Figure 9:
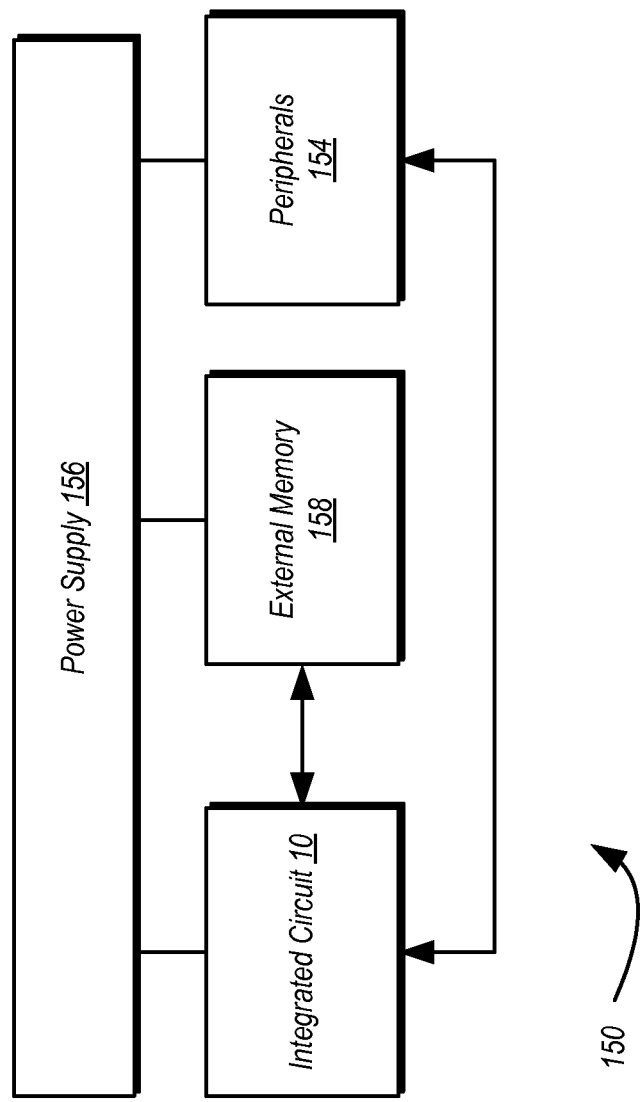
FIG. 9 is a block diagram of an exemplary system.

Turning next to FIG. 9, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   first and second functional circuit blocks, wherein the first and second functional circuit blocks are coupled to one another by a source synchronous interface, wherein the source synchronous interface includes:
   a clock transmitter configured to transmit a first clock signal from the first functional circuit block to the second functional circuit block;
   a first data transmitter configured to, responsive to a rising edge of the first clock signal, transmit data across a first signal path from the first functional circuit block to a receiver in the second functional circuit block, wherein the receiver is configured to latch the data received from the first signal path responsive to receiving a falling edge of the first clock signal, wherein the first signal path comprises a first wire coupled directly between an output of the first data transmitter and a first input of the receiver in the second functional circuit block;
   a second data transmitter configured to, responsive to a falling edge of the first clock signal, transmit data across a second signal path from the first functional circuit block to the receiver in the second functional circuit block, wherein the receiver is configured to latch the data received from the second signal path responsive to receiving the rising edge of the first clock signal, wherein the second signal path comprises a second wire coupled directly between an output of the second data transmitter and a second input of the receiver in the second functional circuit block;
   wherein the first and second data transmitters are both coupled to receive data serially via a third data path in the first functional circuit block, and wherein the first and second signal paths are separate from one another, wherein the data conveyed over the third data path is at a data rate that is double a data rate of the data that is transmitted over the first and second signal paths.

2. The integrated circuit as recited in claim 1, wherein the receiver is configured to combine data received via the first and second data paths to be conveyed serially to circuitry in the second functional circuit block on a fourth data path.

3. The integrated circuit as recited in claim 2, wherein the receiver comprises a dual-edge triggered flip-flop.

4. The integrated circuit as recited in claim 2, wherein the receiver comprises a first flip-flop configured to be transparent responsive to the falling edge of the first clock signal and a second flip-flop configured to be transparent to the rising edge of the first clock signal, wherein data outputs of each of the first and second flip-flops are coupled to the fourth data path.

5. The integrated circuit as recited in claim 4, wherein the second functional circuit block includes a first-in, first-out memory (FIFO) coupled to receive data from the receiver via the fourth data path, wherein the FIFO is configured to receive data according to a second clock signal having a frequency that is twice that of the first clock signal.

6. The integrated circuit as recited in claim 5, further comprising a clock doubler circuit coupled to receive the first clock signal and configured to generate the second clock signal based on the first clock signal.

7. The integrated circuit as recited in claim 4, further comprising a first-in, first-out memory (FIFO) coupled to receive data from the receiver via the fourth data path, wherein the FIFO is a dual-edge triggered FIFO coupled to receive the first clock signal.

8. The integrated circuit as recited in claim 1, wherein each of the first and second signal paths each include at least one repeater.

9. A method comprising:
receiving data serially, from a first functional circuit block, on respective data inputs of first and second flip-flops, wherein the respective data inputs are each coupled to receive the serial data via a first signal line, wherein data is conveyed over the first signal line at a first data rate;
transmitting data serially from the first flip-flop of a transmitter, at a second data rate that is one half the first data rate, to a receiver via a second signal line responsive to a rising edge of a first clock signal;
transmitting the rising edge of the first clock signal to the receiver along with the data transmitted from the first flip-flop;
transmitting data serially from the second flip-flop of the transmitter, at the second data rate to the receiver via a third signal line responsive to a falling edge of the first clock signal, the falling edge of the first clock signal being a next transition of the first clock signal subsequent to the rising edge of the first clock signal, and wherein the third signal line is separate from the second signal line;
transmitting the falling edge of the first clock signal to the receiver along with the data transmitted from the second flip-flop;
the receiver receiving the first clock signal from the transmitter;
the receiver receiving and latching the data from the second signal line responsive to receiving the falling edge of the first clock signal from the transmitter, wherein the second signal line is coupled directly between an output of the first flip-flop and a first input of the receiver; and
the receiver receiving and latching the data from the third signal line responsive to receiving the rising edge of the first clock signal from the transmitter, wherein the third signal line is coupled directly between an output of the second flip-flop and a second input of the receiver.

10. The method as recited in claim 9, further comprising the receiver conveying data serially to a second functional circuit block on a fourth signal line, wherein the receiver is configured to convey data received from the first flip-flop responsive to the rising edge of the first clock signal and data received from the second flip-flop responsive to the falling edge of the first clock signal.

11. The method as recited in claim 9, wherein the receiver comprises a dual-edge triggered flip-flop.

12. The method as recited in claim 9, wherein the receiver comprises third and fourth flip-flops, and wherein the method further comprises:
the third flip-flop receiving data from the transmitter via the second signal line;
latching the data received by the third flip-flop responsive to the third flip-flop receiving the falling edge of the first clock signal received from the transmitter;
the fourth flip-flop receiving data from the transmitter via the third signal line; and
latching the data received by the fourth flip-flop responsive to the fourth flip-flop receiving the rising edge of the first clock signal received from the transmitter.

13. The method as recited in claim 9, further comprising:
the first functional circuit block conveying data to the transmitter via the first signal line and at the first data rate;
the first flip-flop of the transmitter conveying data to the receiver via the second signal line at the second data rate;
the second flip-flop of the transmitter conveying data to the receiver via the third signal line at the second data rate;
the receiver conveying data to the second functional circuit block via a fourth signal line at the first data rate.

14. The method as recited in claim 9, wherein the second functional circuit block includes a first-in, first-out memory (FIFO) coupled to receive data from the receiver, wherein the method further comprises the FIFO receiving data according to a second clock signal having a frequency that is twice that of the first clock signal.

15. A system comprising:
a first functional circuit block;
a second functional circuit block;
a source synchronous interface coupled between the first and second functional circuit blocks, wherein the source synchronous interface includes:
a transmitter configured to:
transmit a clock signal, each cycle of the clock signal having a rising edge and a falling edge;
receive a plurality of data bits serially from the first functional circuit block via a first signal path at a first data rate;
transmit, responsive to rising edges of the clock signal, a first subset of the plurality of bits on a second signal path at a second data rate that is one half of the first data rate;
transmit, responsive to falling edges of the clock signal, a second subset of the plurality of bits on a third signal path at the second data rate, wherein the first and second signal paths are separate from one another; and
a receiver coupled to receive the clock signal and further coupled to receive the first and second subsets of the plurality of bits via the second and third signal paths, respectively, and configured to convey each of the plurality of bits to the second functional circuit block, via a fourth signal path, at the first data rate;
wherein the receiver is configured to latch bits of the first subset received via the second signal path responsive to the falling edges of the clock signal, the second signal path being a wire coupled directly between a first output of the transmitter and a first input of the receiver, and further configured to latch bits of the second subset received via the third signal path responsive to the rising edges of the clock signal, the third signal path being a wire coupled directly between a second output of the transmitter and a second input of the receiver.

16. The system as recited in claim 15, wherein the transmitter includes:

a first flip-flop configured transmit a corresponding bit of the first subset of the plurality of bits on each rising edge of the clock signal; and a second flip-flop configured to transmit a corresponding bit of the second subset of the plurality of bits on each falling edge of the clock signal;

wherein respective data inputs of each of the first and second flip-flops are coupled to the first signal path.

17. The system as recited in claim 16, wherein the receiver includes:

a third flip-flop configured to receive a corresponding bit of the first subset of the plurality of bits on each received falling edge of the clock signal; and a fourth flip-flop configured to receive a corresponding bit of the second subset of the plurality of bits on each received rising edge of the clock signal;

wherein respective data outputs of the third and fourth flip-flops are each coupled to the fourth signal path; and wherein the third and fourth flip-flops are configured to alternately convey bits of the first and second subsets of the plurality of bits onto the fourth signal path.

18. The system as recited in claim 16, wherein the receiver includes a dual-edge triggered flip-flop having a first data input coupled to the second signal path and a second data input coupled to the third signal path, wherein the dual-edge triggered flip-flop is configured to be transparent to the second signal path responsive to receiving a rising edge of the clock signal and transparent to the third signal path responsive to receiving a falling edge of the clock signal, wherein the dual-edge triggered flip-flop further includes a single output and is configured to convey data onto the fourth signal path at the first data rate.

* * * * *

UNITED STATES PATENT AND TRADEMARK OFFICE
CERTIFICATE OF CORRECTION

PATENT NO. : 9,698,967 B2 Page 1 of 1
APPLICATION NO. : 14/851290
DATED : July 4, 2017
INVENTOR(S) : Bo Tang et al.

It is certified that error appears in the above-identified patent and that said Letters Patent is hereby corrected as shown below:

In the Claims

Column 11, Claim 16, Line 11, please delete "configured transmit" and insert --configured to transmit--.

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*